United States Patent
Li et al.

(10) Patent No.: US 11,158,702 B2
(45) Date of Patent: Oct. 26, 2021

(54) GALLIUM NITRIDE HIGH ELECTRON MOBILITY TRANSISTOR HAVING HIGH BREAKDOWN VOLTAGE AND FORMATION METHOD THEREFOR

(71) Applicant: Shanghai Simgui Technology Co., Ltd., Shanghai (CN)

(72) Inventors: Chen Li, Shanghai (CN); Fawang Yan, Shanghai (CN); Feng Zhang, Shanghai (CN); Beiji Zhao, Shanghai (CN); Chunxue Liu, Shanghai (CN)

(73) Assignee: Shanghai Simgui Technology Co., Ltd., Shanghai (CN)

( * ) Notice: Subject to any disclaimer, the term of this patent is extended or adjusted under 35 U.S.C. 154(b) by 0 days.

(21) Appl. No.: 16/559,284

(22) Filed: Sep. 3, 2019

(65) Prior Publication Data
US 2019/0393300 A1   Dec. 26, 2019

Related U.S. Application Data

(63) Continuation of application No. PCT/CN2017/090232, filed on Jun. 27, 2017.

(30) Foreign Application Priority Data

Mar. 3, 2017 (CN) .......................... 20171012293.5

(51) Int. Cl.
*H01L 29/06* (2006.01)
*H01L 21/3065* (2006.01)
(Continued)

(52) U.S. Cl.
CPC ...... *H01L 29/0611* (2013.01); *H01L 21/3065* (2013.01); *H01L 29/2003* (2013.01); *H01L 29/66431* (2013.01); *H01L 29/778* (2013.01)

(58) Field of Classification Search
CPC combination set(s) only.
See application file for complete search history.

(56) References Cited

U.S. PATENT DOCUMENTS 9,214,538 B2 * 12/2015 Marino ............... H01L 29/7787
2013/0020584 A1 * 1/2013 Oishi ................... H01L 29/1029
257/76
(Continued)

FOREIGN PATENT DOCUMENTS

CN  102130158 A  7/2011
CN  104377241 A  2/2015
(Continued)

OTHER PUBLICATIONS

Nakajima et al, GaN-based bidirectional Super HFETs Using polarization junction concept on insulator substrate, Power Semiconductor Devices and ICS (ISPSD) IEEE, pp. 265-268, (Year: 2012).*
(Continued)

*Primary Examiner* — Mamadou L Diallo
(74) *Attorney, Agent, or Firm* — Arch & Lake LLP

(57) ABSTRACT

A gallium nitride high electron mobility transistor and a formation method therefor are provided. The transistor includes: a substrate; a gallium nitride channel layer disposed on the substrate; a first barrier layer disposed on the gallium nitride channel layer; a gate, a source and a drain disposed on the first barrier layer, the source and the drain being respectively disposed on two sides of the gate; and a second barrier layer disposed on a surface of the first barrier layer between the gate and the drain, a side wall of the second barrier layer being connected to a side wall on one side of the gate and being configured to generate two-dimensional hole gas. The high electron mobility transistor has a higher breakdown voltage.

10 Claims, 3 Drawing Sheets

(51) Int. Cl.
*H01L 29/20* (2006.01)
*H01L 29/66* (2006.01)
*H01L 29/778* (2006.01)

(56) References Cited

U.S. PATENT DOCUMENTS

| | | | | |
|---|---|---|---|---|
| 2013/0105817 | A1* | 5/2013 | Saunier | H01L 29/7787 |
| | | | | 257/77 |
| 2013/0126942 | A1* | 5/2013 | Nakajima | H01L 29/1075 |
| | | | | 257/192 |
| 2014/0001478 | A1* | 1/2014 | Saunier | H01L 29/66462 |
| | | | | 257/76 |
| 2014/0042455 | A1* | 2/2014 | Chyi | H01L 29/778 |
| | | | | 257/76 |
| 2017/0110598 | A1* | 4/2017 | Chen | H01L 29/66143 |
| 2018/0248027 | A1* | 8/2018 | Okita | H01L 27/098 |
| 2018/0294335 | A1* | 10/2018 | Luo | H01L 29/7827 |
| 2020/0119179 | A1* | 4/2020 | Mishra | H01L 29/0692 |

FOREIGN PATENT DOCUMENTS

| | | |
|---|---|---|
| CN | 105870164 A | 8/2016 |
| CN | 106876443 A | 6/2017 |

OTHER PUBLICATIONS

English Translation of International Search Report corresponding to PCT/CN2017/090232 dated Dec. 8, 2017, (4p).

\* cited by examiner

GALLIUM NITRIDE HIGH ELECTRON MOBILITY TRANSISTOR HAVING HIGH BREAKDOWN VOLTAGE AND FORMATION METHOD THEREFOR

CROSS-REFERENCE TO RELATED APPLICATIONS

The present application is a continuation application of International Application No. PCT/CN2017/090232, filed with the State Intellectual Property Office of P. R. China on Jun. 27, 2017, which is based upon and claims priority to Chinese Patent Application No. 201710122935.0, filed on Mar. 3, 2017, the entirety contents of which are incorporated herein by reference.

TECHNICAL FIELD

The present disclosure relates to the technical field of semiconductors, and in particular, relates to a gallium nitride high electron mobility transistor having a high breakdown voltage and a formation method therefor.

BACKGROUND

Gallium nitride (GaN) is greatly concerned because gallium nitride may accommodate such high performance requirements as high temperature, high frequency, high voltage, high power, anti-irradiation and the like in the modern electronics technology. A GaN-based high electron mobility transistor (HEMT), used as a power device, is a frontline hotspot technology which is in energetic development in the worldwide, and is also a core technique in the key power electronic technology that needs to be urgently developed in China energy development field.

Although the GaN-based HEMT has a high theoretic breakdown voltage, the GaN-based HEMT used as a power switch device has a high voltage resistance which is far less than a theoretically calculated breakdown voltage. This greatly restricts application of the GaN-based HEMT in the field of high voltage and high power field. Studies reveal that the GaN-based HEMT has a low breakdown voltage mainly because a gate electric field concentration effect and current leakage of a buffer layer, especially the gate electric field concentration effect. To be specific, in an off state, when a device suffers a high voltage between a source and a drain, the end of the gate proximal to the drain may generate an electric field peak which causes non-uniform electric field distribution. As a result, the device is broken down ahead of time.

At present, various metal layer field plate structures are fabricated in the source region, the gate region or the drain region to smoothen the surface electric field distribution to improve the breakdown voltage. This approach of the field plate structure may improve the breakdown voltage to some extents. However, due to lattice mismatch and thermal stress mismatch between the metal and gallium nitride, defects and interface charge traps may be additionally introduced. As a result, quality of the device is degraded, and reliability and stability of the device are adversely affected.

Therefore, finding a specific solution to improving the breakdown voltage of a GaN-based HEMT power device and sufficiently taking advantages of the high voltage and high power of the GaN-based electronic power device are significant.

SUMMARY

A technical problem to be solved by the present disclosure is to provide a gallium nitride high electron mobility transistor having a high breakdown voltage and a formation method therefor, to improve the breakdown voltage of the high electron mobility transistor.

In view of the above problem, the present disclosure provides a gallium nitride high electron mobility transistor having a high breakdown voltage. The transistor includes: a substrate; a gallium nitride channel layer disposed on the substrate; a first barrier layer disposed on the gallium nitride channel layer; a gate, a source and a drain disposed on the first barrier layer, the source and the drain being respectively disposed on two sides of the gate; and a second barrier layer disposed on a surface of the first barrier layer between the gate and the drain, a side wall of the second barrier layer being connected to a side wall on one side of the gate and being configured to generate two-dimensional hole gas.

The present disclosure further provides a formation method for a gallium nitride high electron mobility transistor. The method includes: providing a substrate; forming a gallium channel layer and a first barrier layer disposed on the gallium channel layer in sequence on the substrate; forming a second barrier layer on a surface of the first barrier layer, the second barrier layer being configured to generate two-dimensional hole gas; etching the second barrier layer to expose a part of the surface of the first barrier layer; and forming a source, a drain and a gate on the surface of the first barrier layer respectively, the gate being positioned between the source and the second barrier layer, and a side wall on one side of the gate being connected to a side wall of the second barrier layer.

DETAILED DESCRIPTION

Specific embodiments illustrating a gallium nitride high electron mobility transistor having a high breakdown voltage and a formation method therefor according to the present disclosure are described hereinafter in detail with reference to the accompanying drawings.

Figure 1:
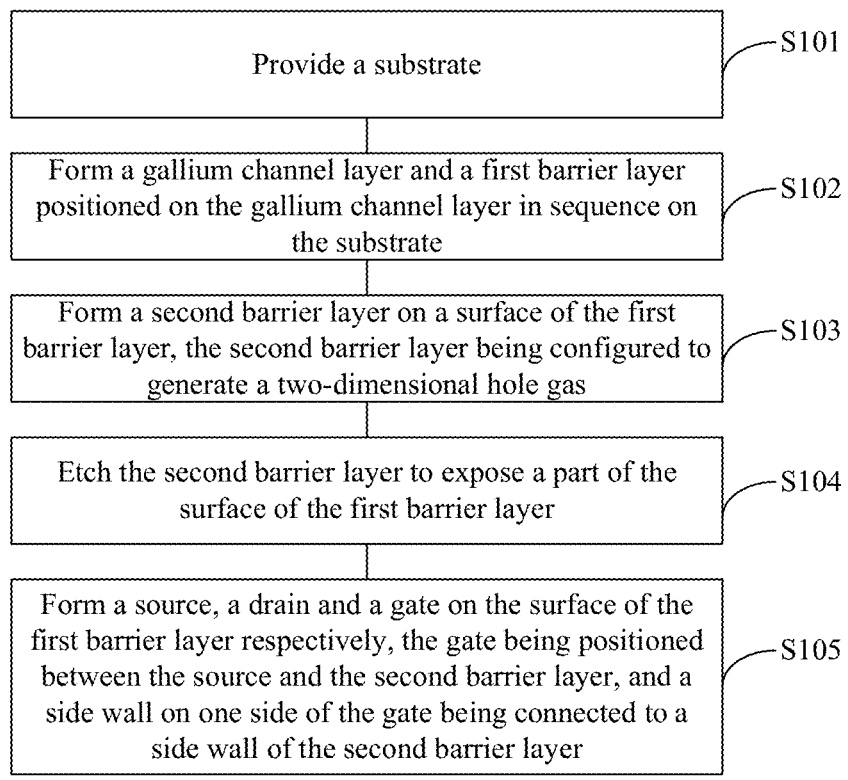
FIG. 1 is a schematic flowchart of a formation method for a gallium nitride high electron mobility transistor having a high breakdown voltage according to an aspect of the present disclosure.

Referring to FIG. 1, a schematic flowchart of a formation method for a gallium nitride high electron mobility transistor having a high breakdown voltage according to a one or more embodiments of the present disclosure is given.

The formation method for a gallium nitride high electron mobility transistor having a high breakdown voltage includes: step S101: providing a substrate; step S102: forming a gallium channel layer and a first barrier layer disposed on the gallium channel layer in sequence on the substrate; step S103: forming a second barrier layer on a surface of the first barrier layer, the second barrier layer being configured to generate two-dimensional hole gas; step S104: etching the second barrier layer to expose a part of the surface of the first barrier layer; and step S105: forming a source, a drain and a gate on the surface of the first barrier layer respectively, the gate being positioned between the source and the second barrier layer, and a side wall on one side of the gate being connected to a side wall of the second barrier layer.

Referring to FIG. 2 to FIG. 6, schematic sectional structural diagrams of a formation process of the gallium nitride high electron mobility transistor having a high breakdown voltage according to one or more embodiments are given.

Figure 2:
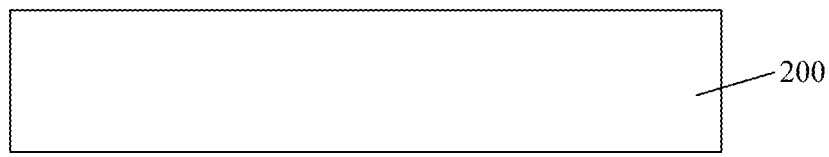
FIG. 2 illustrates a schematic sectional structural diagram after a first step of a formation process of the gallium nitride high electron mobility transistor according to a second aspect of the disclosure.

Referring to FIG. 2, a substrate 200 is provided.

The substrate 200 may be made of sapphire, silicon carbide, silicon, zinc oxide, lithium aluminate, aluminum nitride, gallium nitride, or the like.

Figure 3:
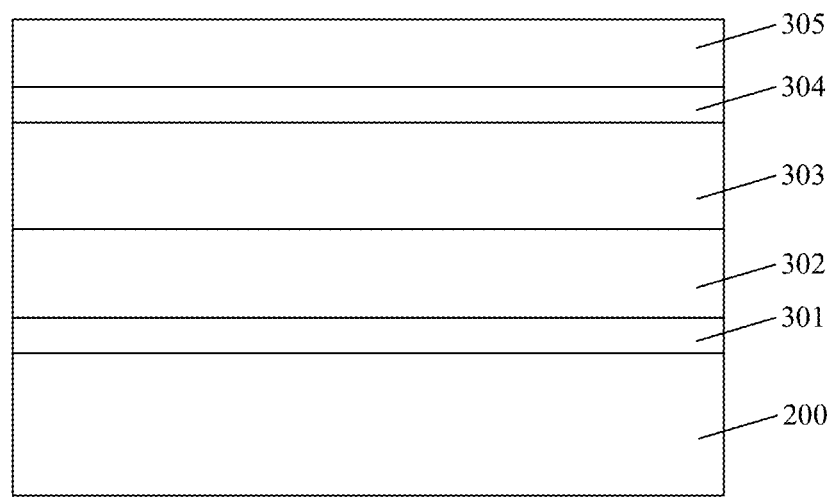
FIG. 3 illustrates a schematic sectional structural diagram after a second step of the formation process of the gallium nitride high electron mobility transistor.

Referring to FIG. 3, a channel layer 303 and a first barrier layer 305 disposed on a surface of the channel layer 303 are formed on the substrate 200 in sequence.

The channel layer 303, as a transmission channel of two-dimensional electron gas, needs to have a higher crystal quality to reduce a background concentration in the channel, such that diffraction and mobility of the two-dimensional electron gas are reduced. The channel 303 may also be made of a non-doped group III metal nitride, for example, a non-doped GaN layer.

The first barrier layer 305 and the channel layer 303 form a heterojunction, wherein non-contiguous energy band levels, and piezo polarization and spontaneous polarization on an interface of the heterojunction may generate the two-dimensional electron gas having a high concentration. The first barrier layer 305 may be made of materials including aluminum gallium nitride and indium aluminum nitride, and may have a single layer or a multi-layer structure.

In one or more embodiments of the present disclosure, the process further includes: forming a nucleation layer 301 and a buffer layer 302 disposed on a surface of the nucleation layer 301 between the substrate 200 and the channel layer 303.

The nucleation layer 301 is mainly intended to provide an effective nucleation center for growth of a subsequent epitaxial layer, and meanwhile release a mismatch stress between the nucleation layer and the substrate by virtue of formation of a large number of dislocations and defects. This may remarkably improve quality of a group III metal nitride layer epitaxially grown on the nucleation layer 301. The nucleation layer 301 may be made of materials including GaN, AlN and AlGaN.

The buffer layer 302 has a higher resistivity to prevent electrons in the channel layer 303 from leaking to the buffer layer 302. It is generally required that the buffer layer 302 has a resistivity over $10^6$ ohms cm. The buffer layer 302 may be made of gallium nitride, and deep level defects are generated in the buffer layer to form a high resistance by virtue of ion injection, or a high resistance is obtained by introduction of P-type impurity doping and compensation for an N-type background concentration. In other embodiments of the present disclosure, the buffer layer 302 having a high resistivity may also be obtained in other ways.

In one or more embodiments of the present disclosure, the process further includes: forming an insert layer 304 between the channel layer 303 and the first barrier layer 305.

The insert layer 304 is configured to improve crystal quality of the first barrier layer 305, and the insert layer 304 may be made of aluminum nitride.

The nucleation layer 301, the buffer layer 302, the channel layer 303, the insert layer 304 and the first barrier layer 305 may be formed by an atomic layer deposition process, a metal-organic chemical vapor deposition process, a molecular beam epitaxy process or a hydride vapor phase epitaxy process.

In other embodiments of the present disclosure, a part of the structures of the nucleation layer 301, the buffer layer 302 or the insert layer 304 may be only formed.

Figure 4:
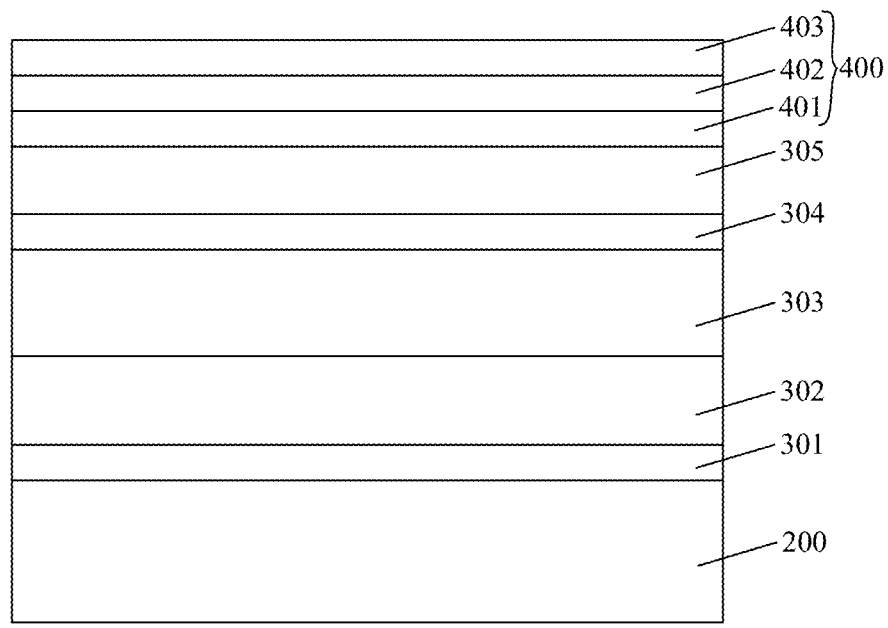
FIG. 4 illustrates a schematic sectional structural diagram after a third step of the formation process of the gallium nitride high electron mobility transistor.

Referring to FIG. 4, a second barrier layer 400 is formed on a surface of the first barrier layer 305, wherein the second barrier layer 400 is configured to generate two-dimensional hole gas.

The second barrier layer 400 may be made of materials including group III metal nitrides for generating the two-dimensional hole gas, for example, P-doped group III metal nitride or a heterojunction capable of generating the two-dimensional hole gas.

In one or more embodiments of the present disclosure, the second barrier layer 400 includes: a first sub-layer 401 disposed on the surface of the first barrier layer 305, a second sub-layer 402 disposed on a surface of the second sub-layer 401 and a third sub-layer 403 disposed on a surface of the second sub-layer 402, wherein the first sub-layer 401 and the second sub-layer 402 form a heterojunction, and the third sub-layer 403 is P-doped.

In one or more embodiments of the present disclosure, the first sub-layer 401 is made of aluminum nitride, gallium nitride or aluminum gallium nitride; the second sub-layer 402 is made of gallium nitride, aluminum nitride or aluminum gallium nitride; and the third sub-layer 403 is made of P-type gallium nitride, P-type aluminum nitride or P-type aluminum gallium nitride. The first sub-layer 401 and the second sub-layer 402 form a heterojunction, and a ratio of the aluminum element and/or the gallium element in the first sub-layer 401 and the second sub-layer 402 is adjusted such that the two-dimensional hole gas is generated on the interface of the first sub-layer 401 and the second sub-layer 402.

The first sub-layer 401 may have a thickness of 1 nm to 100 nm; the second sub-layer 402 may have a thickness of 1 nm to 100 nm; and the third sub-layer 403 may have a thickness of 1 nm to 100 nm.

In other specific embodiments of the present disclosure, other suitable materials may be used to form the second barrier layer 400 having a single-layer or a multi-layer structure, such that the second barrier layer 400 generates the two-dimensional hole gas under the condition of spontaneous polarization or external electrode polarization.

The second barrier layer 400 may also be formed by the atomic layer deposition process, the metal-organic chemical vapor deposition process, the molecular beam epitaxy process or the hydride vapor phase epitaxy process.

Figure 5:
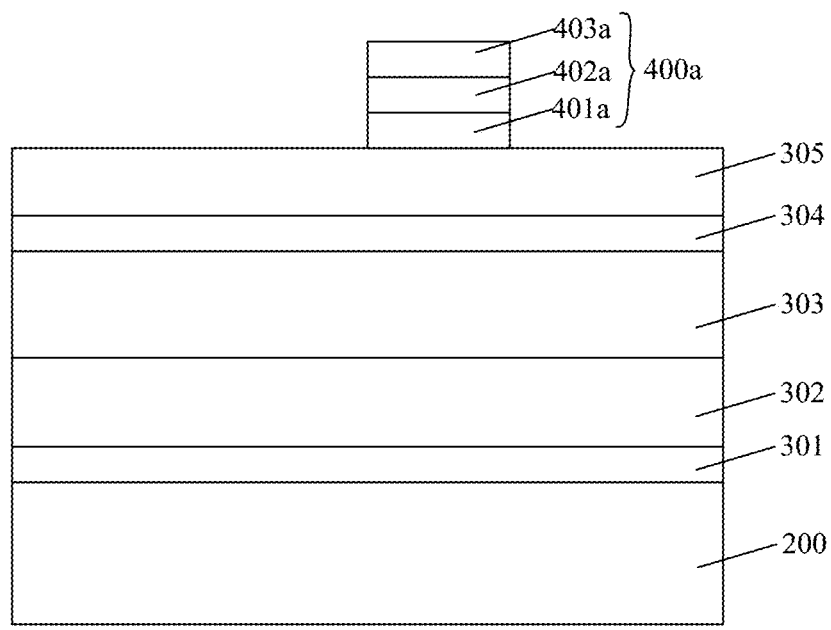
FIG. 5 illustrates a schematic sectional structural diagram after a fourth step of the formation process of the gallium nitride high electron mobility transistor.

Referring to FIG. 5, the second barrier layer 400 is etched to expose a part of the surface of the first barrier layer 305.

The second barrier layer 400 is pattern-like etched to reserve a partial second barrier layer 400a positioned above the channel region between the gate and the drain of an HEMT to be formed. In one or more embodiments of the present disclosure, the second barrier layer 400a includes: a first sub-layer 401a disposed on the surface of the first barrier layer 305, a second sub-layer 402a disposed on a surface of the first sub-layer 401a and a third sub-layer 403a disposed on a surface of the second sub-layer 402a.

The second barrier layer 400 may be etched by a dry etch process. Further, the second barrier layer 400 may be etched by a low-damage dry etch process to prevent great damages to the second barrier layer 400 and avoid impacts to quality of the interface between the second barrier layer 400 and the subsequently formed gate. In one or more embodiments of the present disclosure, the second barrier layer 400 may also be etched by a reactive ion etch process or an inductively coupled plasma etch process, with an etching gas including $Cl_2$ and $BCl_3$.

Figure 6:
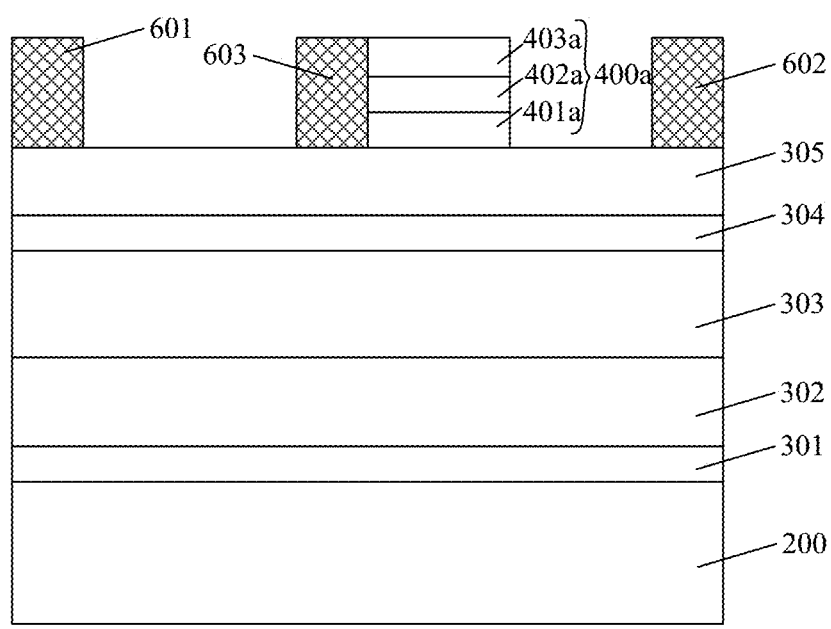
FIG. 6 illustrates a schematic sectional structural diagram after a fifth step of the formation process of the gallium nitride high electron mobility transistor.

Referring to FIG. 6, a source 601, a drain 602 and a gate 603 are formed on the surface of the first barrier layer 305 respectively, wherein the gate 603 is positioned between the source 601 and a second barrier layer 600, and a side wall on one side of the gate 603 is connected to a side wall of the second barrier layer 400.

A method for forming the source 601, the drain 602 and the gate 603 includes: forming a metal layer covering the first barrier layer 305 and the second barrier layer 400a, for example, Ti, Al, Cu, Au, Ag, or the like; and pattern-like etching the metal layer such that the source 601, the drain 602 and the gate 603 disposed on the surface of the first barrier layer 305 are formed, and the gate 603 is positioned between the source 601 and the second barrier layer 400a and a side wall of the gate 603 is connected to a side wall of the second barrier layer 400a, to generate two-dimensional hole gas by polarizing the gate 603 and the second barrier layer 400a.

By polarization, the second barrier layer 400a generates the two-dimensional hole gas, and improves the breakdown voltage of the high electron mobility transistor. In one or more embodiments of the present disclosure, by using impurity ionization of the P-doped third sub-layer 403a and the two-dimensional hole gas generated by charge polarization on the interface between the second sub-layer 402a and the first sub-layer 401a, the second barrier layer 400a exhausts two-dimensional electron gas in a channel in a drift region between the gate and the drain, smoothens electric field distribution of the channel, and thus improves the breakdown voltage of the high electron mobility transistor.

In an embodiment of the present disclosure, 8-inch silicon with orientation <111> is used as the substrate, and afterwards, the nucleation layer of aluminum nitride, the buffer layer of gallium nitride, the channel layer of gallium nitride, the insert layer of aluminum nitride, the barrier layer of aluminum gallium nitride, the first sub-layer of aluminum nitride, the second sub-layer of gallium nitride and the third sub-layer of P-type gallium nitride are epitaxially grown by metal-organic chemical vapor deposition (MOCVD). The MOCVD system is a planetary reaction chamber G5+ manufactured by Aixtron in Germany, which may accommodate five 8-inch silicon substrates. A growing temperature is 1100 to 1150° C., trimethylaluminum (TMAl) has a flow rate of 50 μmol/min to 180 μmol/min, and trimethylgallium (TMGa) has a flow rate of 80 μmol/min to 220 μmol/min. Ammonia is supplied by group V raw materials, which has a flow rate of 5 slm to 50 slm. Hydrogen and nitrogen are carrier gases, which have a flow rate of 10 slm to 80 slm. The first sub-layer of aluminum nitride has a thickness of 20 nm, the second sub-layer of gallium nitride has a thickness of 50 nm, and the third sub-layer of P-type gallium nitride has a thickness of 100 nm.

Afterwards, the first sub-layer of aluminum nitride, the second sub-layer of gallium nitride and the third sub-layer of P-type gallium nitride are etched by an inductively coupled plasma (ICP) process, but a part of the region between the gate and the drain is reserved. An etching gas used in the ICP process is boron trichloride ($BCl_3$) and $Cl_2$, wherein $BCl_3$ has a flow rate of 100 sccm, $Cl_2$ has a flow rate of 5 sccm, and an etching power is 50 W. Subsequently, the source, the gate and the drain are respectively fabricated. A composite layer of a Ti layer and an Al layer formed by virtue of electron beam deposition is used as an electrode metal, wherein the Ti layer has a thickness of 20 nm, the Al layer has a thickness of 200 nm, and annealing is carried out at an atmosphere of nitrogen at an annealing temperature of 850° C. and a duration of 30 s.

In another aspect, the present disclosure further provides a high electron mobility transistor having a breakdown voltage.

Referring to FIG. 6, the high electron mobility transistor includes: a substrate 200; a channel layer 303 disposed on the substrate 200; a first barrier layer 305 disposed on the channel layer 303; and a gate 603, a source 601 and a drain 602 disposed on the first barrier layer 305, wherein the source 601 and the drain 602 are disposed on two sides of the gate 603 respectively; and a second barrier layer 400a disposed on a surface of the first barrier layer 305 positioned between the gate 603 and the drain 602, wherein a side wall of the second barrier layer 400a is connected to a side wall on one side of the gate 603 and is configured to generate two-dimensional hole air.

The substrate 200 may be made of sapphire, silicon carbide, silicon, zinc oxide, lithium aluminate, aluminum nitride, gallium nitride or the like.

The channel layer 303, as a transmission channel of two-dimensional electron gas, needs to have a higher crystal quality to reduce a background concentration in the channel, such that diffraction and mobility of the two-dimensional electron gas are reduced. The channel 303 may also be made of a non-doped group III metal nitride, for example, a non-doped GaN layer.

The first barrier layer 305 may be made of materials including aluminum gallium nitride and indium aluminum nitride, and may have a single layer or a multi-layer structure. The first barrier layer 305 and the channel layer 303 form a heterojunction to generate two-dimensional electron gas.

In one or more embodiments of the present disclosure, the high electron mobility transistor further includes: a nucleation layer 301 positioned between the substrate 200 and the channel layer 303, and a buffer layer 302 disposed on a surface of the nucleation layer 301. The nucleation layer 301 may remarkably improve quality of a group III metal nitride layer epitaxially grown on the nucleation layer 301. The nucleation layer 301 may be made of materials including GaN, AlN and AlGaN. The buffer layer 302 has a higher resistivity, and the buffer layer 302 may be made of gallium nitride.

In one or more embodiments of the present disclosure, the high electron mobility transistor further includes an insert layer 304 positioned between the channel layer 303 and the first barrier layer 305, wherein the insert layer 304 is configured to improve crystal quality of the first barrier layer 305, and the insert layer 304 may be made of aluminum nitride.

In other specific embodiments of the present disclosure, the high electron mobility transistor may also have a part of the structures of the nucleation layer 301, the buffer layer 302 and the insert layer 304.

The second barrier layer 400a may be made of materials including group III metal nitrides for generating the two-dimensional hole gas, for example, P-doped group III metal nitride or a heterojunction capable of generating the two-dimensional hole gas. In one or more embodiments of the present disclosure, the second barrier layer 400a includes: a first sub-layer 401a disposed on the surface of the first barrier layer 305, a second sub-layer 402a disposed on a surface of the second sub-layer 401a and a third sub-layer 403a disposed on a surface of the second sub-layer 402a, wherein the first sub-layer 401a and the second sub-layer 402a form a heterojunction, and the third sub-layer 403a is P-doped. In one or more embodiments of the present disclosure, the first sub-layer 401a is made of aluminum nitride, gallium nitride or aluminum gallium nitride; the second sub-layer 402a is made of gallium nitride, aluminum nitride or aluminum gallium nitride; and the third sub-layer 403a is made of P-type gallium nitride, P-type aluminum nitride or P-type aluminum gallium nitride. The first sub-layer 401a and the second sub-layer 402a form a heterojunction, and a ratio of the aluminum element and/or the gallium element in the first sub-layer 401a and the second sub-layer 402a is adjusted such that the two-dimensional hole gas is generated on the interface of the first sub-layer 401a and the second sub-layer 402a.

The first sub-layer 401a may have a thickness of 1 nm to 100 nm; the second sub-layer 402a may have a thickness of 1 nm to 100 nm; and the third sub-layer 403a may have a thickness of 1 nm to 100 nm. In other specific embodiments of the present disclosure, other suitable materials may be used to form the second barrier layer 400a having a single-layer or a multi-layer structure, such that the second barrier layer 400a generates the two-dimensional hole gas under the condition of spontaneous polarization or external electrode polarization.

The source 601, the drain 602 and the gate 603 are all a metal, for example, Ti, Al, Cu, Au, Ag or the like. The gate 603 is positioned between the source 601 and the second barrier layer 600, and a side wall on a side of the gate 603 is connected to a side wall of the second barrier layer 400, such that the two-dimensional hole gas is generated by polarizing the gate 603 and the second barrier layer 400a.

The second barrier layer 400a is capable of generating the two-dimensional hole gas, and thus improving the breakdown voltage for the high electron mobility transistor. In one or more embodiments of the present disclosure, by using impurity ionization of the P-doped third sub-layer 403a and the two-dimensional hole gas generated by charge polarization on the interface between the second sub-layer 402a and the first sub-layer 401a, the second barrier layer 400a exhausts two-dimensional electron gas in a channel in a drift region between the gate and the drain, smoothens electric field distribution of the channel, and thus improves the breakdown voltage of the high electron mobility transistor.

Optionally, the second barrier layer includes: a first sub-layer disposed on the surface of the first barrier layer, a second sub-layer disposed on a surface of the second sub-layer and a third sub-layer disposed on a surface of the second sub-layer, wherein the first sub-layer and the second sub-layer form a heterojunction, and the third sub-layer is P-doped.

Optionally, a nucleation layer and a buffer layer disposed on the nucleation layer are defined between the substrate and the gallium channel layer.

Optionally, an insert layer is further defined between the gallium channel layer and the first barrier layer.

Optionally, the first sub-layer is made of aluminum nitride, gallium nitride or aluminum gallium nitride; the second sub-layer is made of gallium nitride, aluminum nitride or aluminum gallium nitride; the third sub-layer is made from P-type gallium nitride, P-type aluminum nitride or P-type aluminum gallium nitride; the nucleation layer is made of a gallium nitride, aluminum nitride or aluminum gallium nitride; the buffer layer is made of gallium nitride; the insert layer is made of aluminum nitride; and the first barrier layer is made of aluminum gallium nitride or indium aluminum nitride.

Optionally, the second barrier layer includes: a first sub-layer disposed on the surface of the first barrier layer, a second sub-layer disposed on a surface of the second sub-layer and a third sub-layer disposed on a surface of the second sub-layer, wherein the first sub-layer and the second sub-layer form a heterojunction, and the third sub-layer is P-doped.

Optionally, the second barrier layer is etched by a reactive ion etch process or an inductively coupled plasma etch process.

Optionally, the method further includes: forming a nucleation layer and a buffer layer disposed on a surface of the nucleation layer between the substrate and the gallium nitride channel layer; and forming an insert layer between the gallium nitride channel layer and the first barrier layer.

Optionally, the first sub-layer is made of aluminum nitride, gallium nitride or aluminum gallium nitride; the second sub-layer is made of gallium nitride, aluminum nitride or aluminum gallium nitride; the third sub-layer is made from P-type gallium nitride, P-type aluminum nitride or P-type aluminum gallium nitride; the nucleation layer is made of a gallium nitride, aluminum nitride or aluminum gallium nitride; the buffer layer is made of gallium nitride; the insert layer is made of aluminum nitride; and the first barrier layer is made of aluminum gallium nitride or indium aluminum nitride.

In the high electron mobility transistor according to the present disclosure, a second barrier layer is defined between a gate and a drain, wherein the second barrier layer is capable of generating two-dimensional hole gas to exhaust two-dimensional electron gas in a channel in a drift region between the gate and the drain, smoothen electric field distribution of the channel, and thus improve the breakdown voltage of the high electron mobility transistor.

Described above are preferred examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:

1. A gallium nitride high electron mobility transistor, comprising:
    a substrate;
    a gallium nitride channel layer disposed on the substrate;
    a first barrier layer disposed on the gallium nitride channel layer;
    a gate, a source, and a drain disposed on the first barrier layer, the source and the drain being respectively disposed on two sides of the gate;
    a second barrier layer disposed on a surface of the first barrier layer between the gate and the drain, a side wall of the second barrier layer being connected to a side wall on one side of the gate and being configured to generate two-dimensional hole gas; and
    a nucleation layer and a buffer layer disposed on the nucleation layer, wherein the nucleation layer and the buffer layer are disposed between the substrate and the gallium nitride channel layer, and wherein the buffer layer has a resistivity to prevent electrons in the gallium nitride channel layer from leaking to the buffer layer.

2. The gallium nitride high electron mobility transistor according to claim 1, wherein the second barrier layer comprises: a first sub-layer disposed on the surface of the first barrier layer, a second sub-layer disposed on a surface of the second sub-layer and a third sub-layer disposed on a surface of the second sub-layer, the first sub-layer and the second sub-layer forming a heterojunction, and the third sub-layer being P-doped.

3. The gallium nitride high electron mobility transistor according to claim 1, wherein an insert layer is further defined between the gallium channel layer and the first barrier layer.

4. The gallium nitride high electron mobility transistor according to claim 3, wherein the first sub-layer is made of aluminum nitride, gallium nitride or aluminum gallium nitride; the second sub-layer is made of gallium nitride, aluminum nitride or aluminum gallium nitride; the third sub-layer is made from P-type gallium nitride, P-type aluminum nitride or P-type aluminum gallium nitride; the nucleation layer is made of a gallium nitride, aluminum nitride or aluminum gallium nitride; the buffer layer is made of gallium nitride; the insert layer is made of aluminum nitride; and the first barrier layer is made of aluminum gallium nitride or indium aluminum nitride.

5. The gallium nitride high electron mobility transistor according to claim 1, wherein the buffer layer has the resistivity over $10^6$ ohms cm.

6. A formation method for a gallium nitride high electron mobility transistor, comprising:
providing a substrate;
forming a gallium channel layer and a first barrier layer disposed on the gallium channel layer in sequence on the substrate;
forming a second barrier layer on a surface of the first barrier layer, the second barrier layer being configured to generate two-dimensional hole gas;
etching the second barrier layer to expose a part of the surface of the first barrier layer;
forming a source, a drain, and a gate respectively on the surface of the first barrier layer, the gate being positioned between the source and the second barrier layer, and a side wall on one side of the gate being connected to a side wall of the second barrier layer; and
forming a nucleation layer and a buffer layer disposed on a surface of the nucleation layer, wherein the nucleation layer and the buffer layer are disposed between the substrate and the gallium channel layer, and wherein the buffer layer has a resistivity to prevent electrons in the gallium channel layer from leaking to the buffer layer.

7. The formation method for a gallium nitride high electron mobility transistor according to claim 6, wherein the second barrier layer comprises a first sub-layer disposed on the surface of the first barrier layer, a second sub-layer disposed on a surface of the second sub-layer and a third sub-layer disposed on a surface of the second sub-layer, the first sub-layer and the second sub-layer forming a heterojunction, and the third sub-layer being P-doped.

8. The formation method for a gallium nitride high electron mobility transistor according to claim 7, wherein the second barrier layer is etched by a reactive ion etch process or an inductively coupled plasma etch process.

9. The formation method for a gallium nitride high electron mobility transistor according to claim 8, further comprising: forming an insert layer between the gallium nitride channel layer and the first barrier layer.

10. The formation method for a gallium nitride high electron mobility transistor according to claim 9, wherein the first sub-layer is made of aluminum nitride, gallium nitride or aluminum gallium nitride; the second sub-layer is made of gallium nitride, aluminum nitride or aluminum gallium nitride; the third sub-layer is made from P-type gallium nitride, P-type aluminum nitride or P-type aluminum gallium nitride; the nucleation layer is made of a gallium nitride, aluminum nitride or aluminum gallium nitride; the buffer layer is made of gallium nitride; the insert layer is made of aluminum nitride; and the first barrier layer is made of aluminum gallium nitride or indium aluminum nitride.

* * * * *